United States Patent
Seekins et al.

(10) Patent No.: US 10,020,065 B2
(45) Date of Patent: *Jul. 10, 2018

(54) CORRUPTION-PREVENTATIVE PROGRAMMING IN SOLID-STATE DATA STORAGE

(71) Applicant: Western Digital Technologies, Inc., Irvine, CA (US)

(72) Inventors: David S. Seekins, Shakopee, MN (US); Dennis M. Rolland, Santa Ana, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,360

(22) Filed: Jan. 23, 2017

(65) Prior Publication Data
US 2017/0133100 A1    May 11, 2017

Related U.S. Application Data

(63) Continuation of application No. 14/312,144, filed on Jun. 23, 2014, now Pat. No. 9,564,212.

(Continued)

(51) Int. Cl.
| G11C 16/34 | (2006.01) |
| G11C 11/56 | (2006.01) |
| G11C 16/10 | (2006.01) |
| G06F 3/06  | (2006.01) |
| G06F 11/10 | (2006.01) |
| G11C 29/52 | (2006.01) |
| G06F 11/07 | (2006.01) |

(52) U.S. Cl.
CPC ........ *G11C 16/3427* (2013.01); *G06F 3/0608* (2013.01); *G06F 3/0616* (2013.01); *G06F 3/0635* (2013.01); *G06F 3/0652* (2013.01); *G06F 3/0679* (2013.01); *G06F 11/073* (2013.01); *G06F 11/0751* (2013.01); *G06F 11/0793* (2013.01); *G06F 11/1072* (2013.01); *G11C 11/5628* (2013.01); *G11C 16/10* (2013.01); *G11C 29/52* (2013.01)

(58) Field of Classification Search
CPC .................................................. G06F 11/1076
USPC ........................................ 714/764, 768, 770
See application file for complete search history.

(56) References Cited

U.S. PATENT DOCUMENTS 8,862,952 B1 * 10/2014 Booth ................ G11C 16/3468
                                                    711/103
8,880,788 B1 * 11/2014 Sundaram ............. G06F 3/0688
                                                    711/103

(Continued)

*Primary Examiner* — Fritz Alphonse
(74) *Attorney, Agent, or Firm* — Chang & Hale LLP

(57) ABSTRACT

A device includes a non-volatile solid-state memory array comprising a plurality of blocks, each of the plurality of blocks configured to store data in a single-bit per cell mode or a multiple-bit per cell mode, and a controller. The controller is configured to receive write data from a host device, program the write data to a first block of the plurality of blocks of the memory array using the single-bit per cell mode, and perform a data consolidation operation on the first block at least in part by programming at least a portion of the write data together with data stored in a separate second block of the memory array to a third block of the memory array using the multiple-bit per cell mode.

20 Claims, 6 Drawing Sheets

Related U.S. Application Data

(60) Provisional application No. 61/989,420, filed on May 6, 2014.

(56) References Cited

U.S. PATENT DOCUMENTS

| | | | |
|---|---|---|---|
| 9,250,687 B1 * | 2/2016 | Aswadhati | G06F 1/3225 |
| 9,564,212 B2 * | 2/2017 | Seekins | G06F 12/02 |
| 2013/0024460 A1 * | 1/2013 | Peterson | G06F 3/061 |
| | | | 707/741 |

* cited by examiner

CORRUPTION-PREVENTATIVE PROGRAMMING IN SOLID-STATE DATA STORAGE

RELATED APPLICATION

This application is a continuation of U.S. patent application Ser. No. 14/312,144, filed on Jun. 23, 2014, entitled "Solid-State Memory Corruption Mitigation," which claims the benefit of priority under 35 U.S.C. § 119(e) of U.S. Provisional Application No. 61/989,420, filed on May 6, 2014, and entitled "Solid-State Memory Corruption Mitigation," the disclosures of which is hereby incorporated by reference in its entirety.

BACKGROUND

Field

This disclosure relates to data storage systems. More particularly, the disclosure relates to systems and methods for programming solid-state memory.

Description of Related Art

Certain solid-state memory devices, such as flash drives, store information in an array of memory cells constructed with floating gate transistors. Programming failure in a solid-state memory cell may adversely affect device performance.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
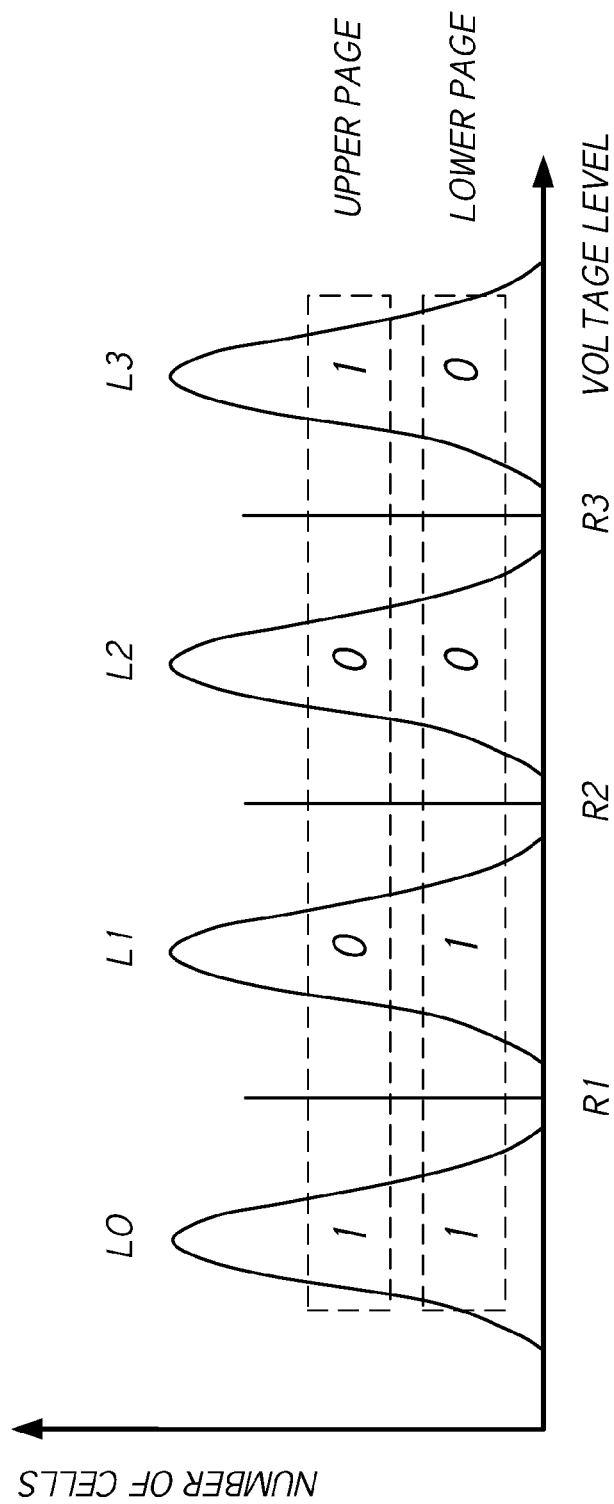
FIG. 1 is a graph showing a probability distribution of cells in a non-volatile memory array according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claimed invention. Disclosed herein are example configurations and embodiments relating to controller board layouts in data storage systems.

Terminology

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

The terms "page," "flash page," "F-page," or variations thereof are used herein according to their broad and ordinary meaning. For example, "page" may refer to a block of a physical memory cells, or to the physical memory cells themselves. Within a multi-level cell (MLC), "page" may refer to either of upper or lower pages in a two-level scheme, or to data represented by most significant or least significant bits, or bits of intermediate significance in a three-level cell (TLC) scheme or schemes with greater granularity. Furthermore, the term "block" may be used herein to refer to groups of pages or to groups of blocks, such as super blocks.

Overview

Multi-level cell (MLC) solid-state memory (e.g., NAND flash) is capable of storing more than one bit of information in a single memory element, or cell. For example, a single cell of MLC memory may store two or more bits of information. For the purpose of illustration, two bits per cell will be assumed in the following teaching examples. In certain embodiments, as described in greater detail below, the two bits of information are not programmed together; programming of each of the two bits may occur at different times. The first bit (e.g., lower page), which may represent a least significant bit (LSB), may be programmed first; later the second bit (e.g., upper page), which may represent a most significant bit (MSB), or more significant bit, may be programmed some number of pages later. Such a programming scheme may result in a cell having one of four possible voltage charge levels, wherein hardware is configured to detect the charge level, resulting in the ability to return four unique states, or two bits of data, from a single cell.

In certain situations, two-stage MLC programming can result in corruption of LSB data. For example, when the upper page programming operation encounters an error or interruption during programming, the lower page may also become corrupted as a result. Programming interruption may be caused by, for example, system power failure. Certain data storage systems include additional circuitry configured to provide backup power to allow for completion of memory access operations upon power failure. For example, one or more capacitors or other charge-holding devices may be used to store power during normal operation and discharge such power for use during power failure. Furthermore, certain disk drive systems are configured to generate back EMF power from a spindle motor after the power supply has been removed. However, cost and/or other considerations may make utilization of such backup power solutions impractical or undesirable. Therefore, certain solid-state storage systems are not configured to substantially prevent loss of LSB data resulting from programming interruption. Loss of the previously programmed lower page data is referred to herein as "LSB corruption," or "paired-page corruption." Further details of LSB corruption in solid-state memory devices are discussed below.

Certain embodiments are disclosed herein for preventing or reducing the effects of LSB corruption resulting from upper page programming interruption in MLC solid-state memory. Certain embodiments may provide a host data programming scheme in which only lower pages of memory are utilized initially for host data write operations, wherein a data consolidation mechanism (e.g., garbage collection) is used to pack the programmed lower page data into open blocks using both upper and lower pages.

LSB Corruption

FIG. 1 is a graph showing a probability distribution of cells in a non-volatile memory array according to an embodiment. The distribution of FIG. 1 is associated with an MLC programming scheme, in which two or more bits of information are stored in a single memory cell. However, it should be understood that systems and methods disclosed herein may be utilized with respect to other technologies, such as three-level cell (TLC) technology.

FIG. 1 shows four programming states (L0-L3), wherein each state represents two bits of data. In certain embodiments, the programming states each comprise a most-significant bit, referred to herein as the "upper page," and a least-significant bit (LSB), which may also be referred to herein as the "lower page." Furthermore, in certain embodiments, "upper page" may refer to the least-significant bit, while "lower page" refers to the most-significant bit. While particular coding values are assigned to the various states of the distribution (e.g., '11' for L0, '01' for L1, '00' for L2, and '10' for L3), other coding schemes may be used. In certain embodiments, L0 corresponds to an erased state.

In decoding memory cells, one or more reference voltage levels may be used to read the cells to determine what charge state the cells belong to. FIG. 1 illustrates three voltage read levels, R1, R2 and R3. In certain embodiments, lower page values may be determined based on a read at R2, while upper page values may be obtained by reading at R1 and/or R3.

Figure 2A:
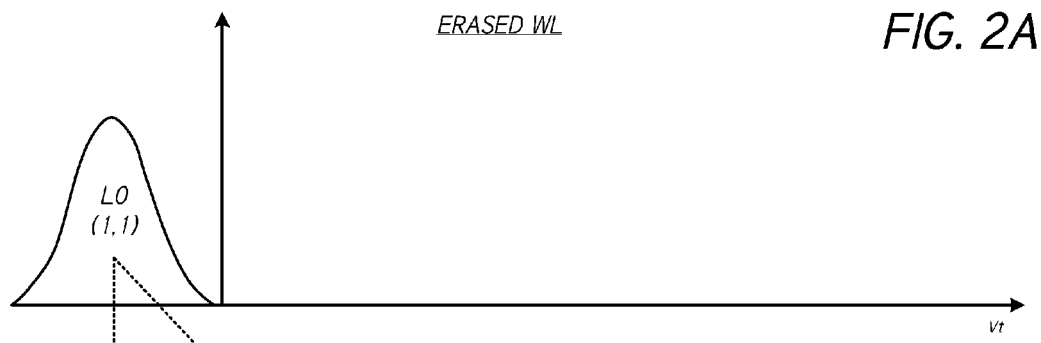
FIGS. 2A-2C illustrate probability distributions of cells at various stages of a programming process according to an embodiment.
Figure 2B:
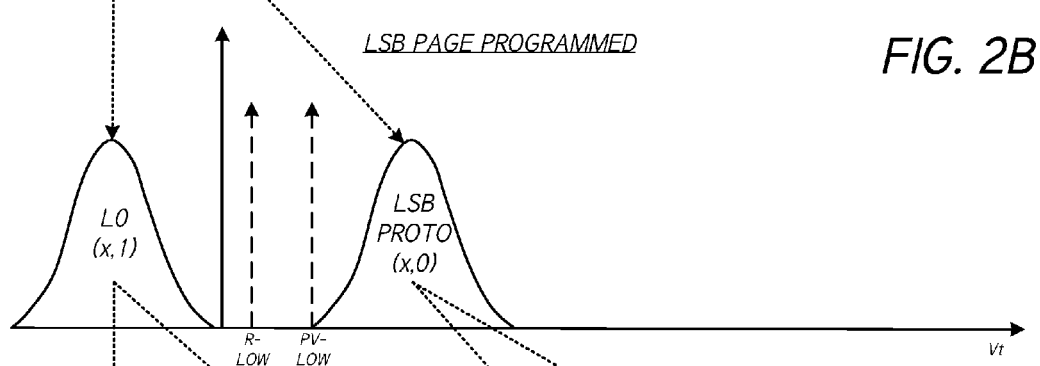
Figure 2C:
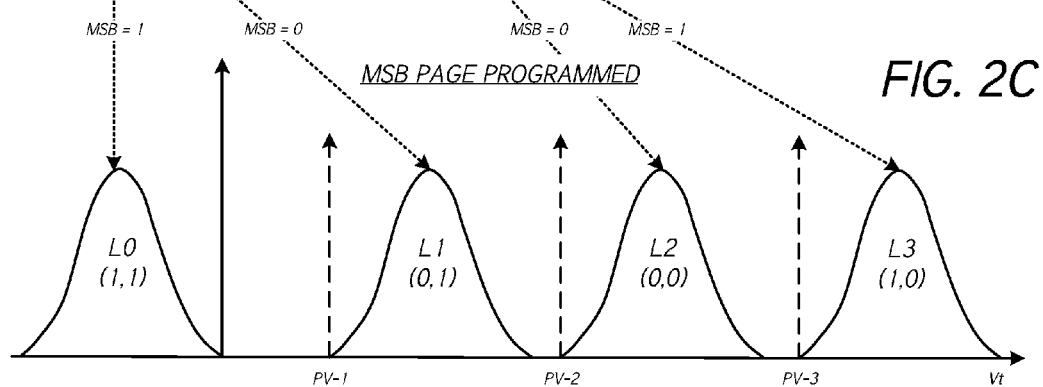

As referenced above, programming in an MLC programming scheme may be performed in multiple stages. FIGS. 2A-2C illustrate probability distributions of cells at various stages of a programming process according to an embodiment. FIG. 2A illustrates a voltage distribution in which cells of a page of solid-state memory are in a first state, such as an erased state. In certain embodiments, cells are initially programmed from an erased state. Therefore, prior to programming, it may be necessary or desirable for a page of solid-state memory to be erased prior to programming to allow for proper programming, as described herein.

In certain embodiments, MLC programming comprises two steps: in a first step, as illustrated in FIG. 2B, an LSB page may be programmed. For example, for a cell having an LSB value of '1,' the cell may remain substantially in a low-voltage erased state, whereas a cell having an LSB value of '0' may be programmed to a level above a higher program voltage (PV-Low). In an embodiment, LSB page programming may be achieved by applying one or more programming pulses to the designated cells to push the programmed cells past PV-Low. Therefore, as illustrated, after LSB programming, the voltage distribution may comprise two separate states, which may be referred to as LSB "proto" states, or pages.

Following LSB programming, the MSB page may be programmed, as illustrated in FIG. 2C. Whereas the LSB page programming may result in division of cells into two proto voltage states (e.g., a first state corresponding to a lower level/state, such as an erased state, and a second state corresponding to a higher level/state), MSB programming may further divide the distribution into four states. For example, as states L0 and L1 both may correspond to an LSB value of '1,' in certain embodiments, the lower LSB proto page may be split into the L0 and L1 states, wherein allocation to L0 or L1 is determined by the relevant MSB value. In certain embodiments, where the MSB page is '1' (and LSB is '1'), cells may be permitted to remain in a lowest voltage state (e.g., erased state). Furthermore, where the MSB page is '0,' the cells may be programmed past a programming voltage level PV-1. With respect to the cells corresponding to an LSB value of '0,' the MSB programming of such cells may be performed by programming cells having an MSB value of '0' past a programming voltage level PV-2 to a third voltage state L2. Furthermore, cells having an MSB value of '1' may be programmed from the higher LSB proto page past a programming voltage PV-3 to a fourth voltage state L3.

Figure 3A:
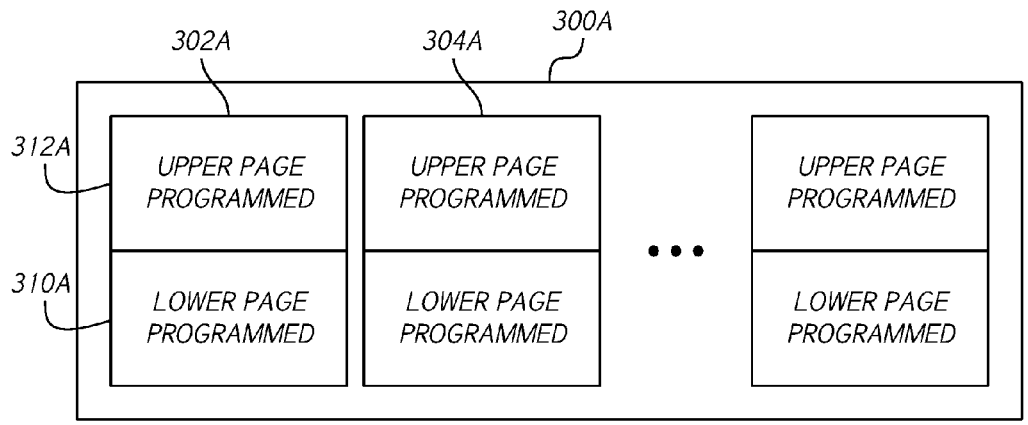
FIG. 3A illustrates a block of solid-state memory programmed in a Multi-Level Cell (MLC) modes according to an embodiment.

LSB, or "paired page," corruption resulting from multi-stage MLC programming can be further illustrated by the logical view of an example MLC memory block 300A shown in FIG. 3A. Block 300A, for example, is programmed in MLC mode and both the block's lower pages (310A) and upper pages (312A) are programmed. Because the process of programming the upper page generally changes the cell's voltage, the data previously programmed in the lower page may be lost or corrupted if power is interrupted during the programming of the upper page. In particular, in order to program the upper page, the lower page may need to be temporarily transitioned to another programmed value, and then after the upper page is programmed, the lower page is transitioned back to the originally-programmed value. If this process is interrupted, data in the lower page, which may have been programmed a substantial amount of time prior, could be lost. In a solid-state hybrid drive application, a data integrity problem may arise if that lower page contains data programmed by a previous deferred write operation, wherein there may not be a back-up copy already written to, for example, magnetic media or other non-volatile memory.

A data storage device may include a capacitor as a backup power source that allows the completion of upper page programming operations in MLC memory in the event of a power interruption. However, as previously discussed above, such a backup power source is not always feasible or available.

Figure 3B:
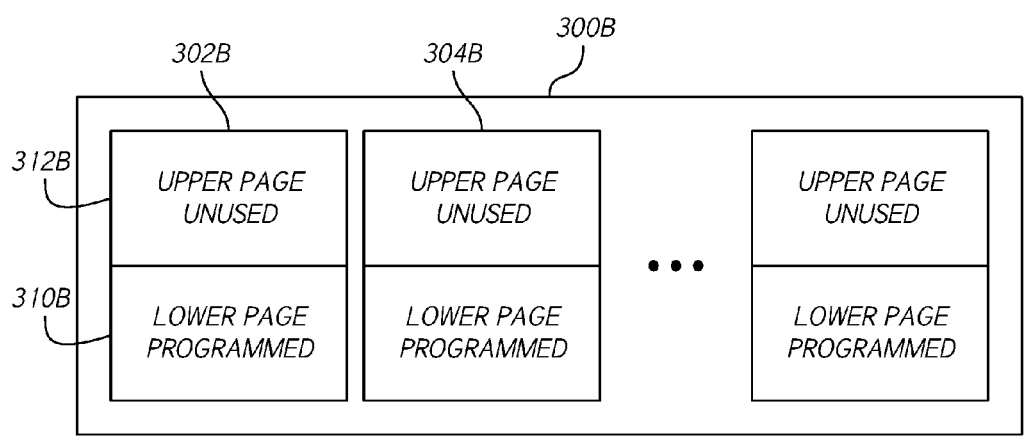
FIG. 3B illustrates a block of solid-state memory programmed in a Lower Page Only (LPO) modes according to an embodiment.

FIG. 3B illustrates a block 300B programmed according to an alternative programming scheme, wherein only lower pages of the block of storage, or portion thereof, are programmed. Such a programming scheme may be referred to herein as "lower page only," or "LPO," programming. As shown, the block 300B includes a plurality of memory cells or units (e.g., 302B), wherein a lower page 310B is programmed, whereas a linked upper page 312B is not programmed. Because only the lower pages of the block are used, the block 300B may have a relatively reduced capacity compared to traditional MLC programming. However, as discussed in greater detail below, LPO programming may not suffer from complications associated with LSB corruption.

LSB Corruption Mitigation System

Figure 4:
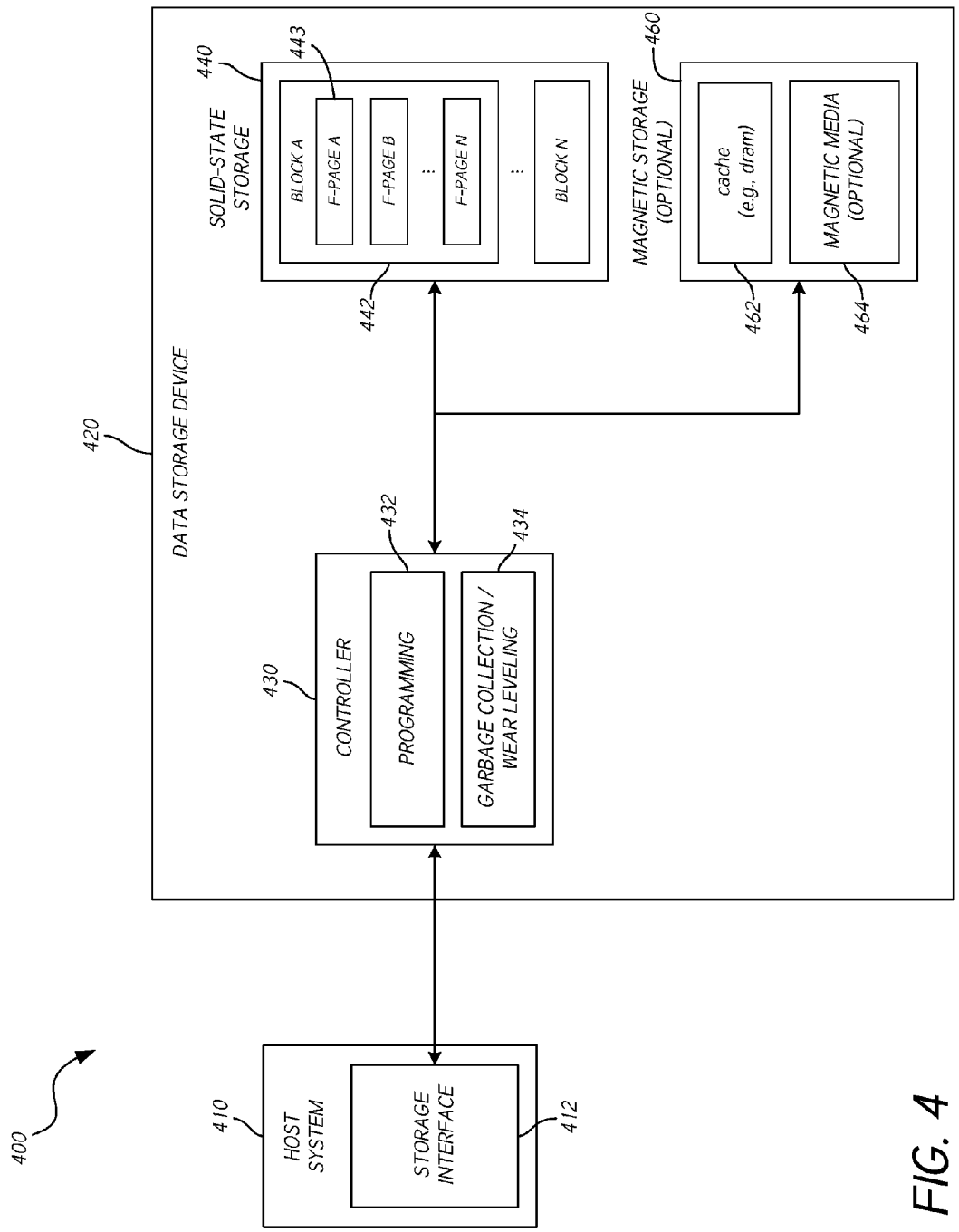
FIG. 4 is a block diagram of a data storage system including a non-volatile memory array according to an embodiment.

FIG. 4 illustrates a system 400 including a host system 410 and a data storage device 420 that implements LSB corruption mitigation according to one or more embodiments disclosed herein. As is shown, the data storage device 420 (e.g., solid-state hybrid drive, solid-state drive, etc.) includes a controller 430 and a non-volatile memory array (e.g., solid-state storage) 440. The non-volatile memory array 440 may include a plurality of chips, or dies, each comprising one or more blocks of storage. For example, the diagram of FIG. 4 illustrates a plurality of blocks, identified as Block "A" (442) through Block "N," which may be disposed on one or more discrete dies. Each block comprises a plurality of flash pages (F-pages). For example, Block A (442) of FIG. 4 includes a plurality of F-pages, identified as F-Pages A (443), B, through N. In some embodiments, each "block" is a smallest grouping of memory pages or locations of the solid-state storage 440 that are erasable in a single operation or as a unit, and each "F-page" or "page" is a smallest grouping of memory cells that can be programmed in a single operation or as a unit. Other embodiments may use blocks and/or pages that are defined differently than as described herein.

In certain embodiments, sets of blocks are grouped together into super blocks. A super block, or "S-Block," may comprise one flash block per die. An S-Block, therefore, may be thought of as a collection of F-Blocks, one F-Block per die, that are combined together to form a logical unit of the solid-state storage 440. According to one embodiment, block allocation, erasure and/or garbage collection may be managed at the S-Block level.

In certain embodiments, the data storage device 420 may be a solid-state hybrid disk drive including a magnetic storage module 460, which comprises magnetic media 464 (e.g., one or more magnetic disks). The solid-state storage 440 may comprise any desirable type of solid-state memory.

The controller 430 can be configured to receive data and/or storage access commands from a storage interface module 412 (e.g., a device driver) of the host system 410. Storage access commands communicated by the storage interface module 412 can include write data and read data commands issued by the host system 410. Read and write commands can specify a logical address (e.g., logical block addresses, or "LBAs") used to access the data storage device 420. The controller 430 can execute the received commands in the solid-state storage 440 and/or magnetic storage device 460.

The programming module 432 of the controller 430 may implement a desirable programming scheme suitable for the solid-state storage 440. In certain embodiments, the programming module 432 is configured to implement an MLC programming scheme in which cells of solid-state memory are programmed to store a charge level representative of two or more bits of data. Such a programming scheme is described above with reference to FIGS. 1 and 2A-2C. In certain embodiments, the programming module 432 may be configured to implement lower page only (LPO) programming of host data to the solid-state storage 440, thereby providing paired page corruption mitigation, as described in greater detail below.

The data storage device 420 can store data communicated by the host system 410. In other words, the data storage device 420 can act as memory storage for the host system 410. To facilitate this function, the controller 430 can implement a logical interface. The logical interface can present to the host system 410 data storage system memory as a set of logical addresses (e.g., contiguous address) where user data can be stored. Internally, the controller 430 can map logical addresses to various physical locations or addresses in the solid-state storage 440 and/or other storage modules.

The controller 430 includes a garbage collection/wear leveling module 434 configured to perform garbage collection and wear leveling. Garbage collection is a type of data consolidation or fragmentation operation. However, as used herein, "garbage collection" may refer to any type of data consolidation or fragmentation operation. Furthermore, as used herein, a wear leveling operation can be considered a sub-part of, or a special case of, an overall garbage collection operation. In some embodiments, the garbage collection/wear leveling module 434 performs solely wear leveling while, in other embodiments, performs garbage collection and/or wear leveling of at least a portion of the solid-state storage 440. In one embodiment, the garbage collection/wear leveling module 432 may function to accommodate paired page corruption mitigation through LPO programming and subsequent data consolidation operations such as garbage collection and/or wear leveling.

In one embodiment, the garbage collection/wear leveling module 434 can select blocks of the solid-state storage 440 on which garbage collection and/or wear leveling is performed. Such block-selection functionality may be performed based at least in part on information related to data age and/or wear leveling. The blocks may be selected in a way that increases the amount of free space through the life of the data storage device 420 and promotes or guarantees that blocks stay within a range of P/E counts, which may maximize the data storage life of the solid-state storage 440.

The data storage device 420 may be configured to mitigate LSB corruption according to one or more embodiments disclosed herein. In certain embodiments, the data storage device 420 uses only lower pages for host writes (e.g., writes host data into blocks in LPO mode), and uses garbage collection, wear leveling, and/or other background/system maintenance operations to pack data into new blocks (e.g., writes data into blocks in MLC mode). For the sake of simplicity, the following examples will use garbage collection as an example illustration. During garbage collection, in the event that an MLC programming operation is unsuccessful, any lost or corrupted lower page data may still be intact in the LPO block(s), such that the write operation may be retried at a later time, such as when power is restored to the system. A side benefit of writing host data in LPO mode is that write performance may be improved by, for example, a factor of two or greater, compared to write performance of typical MLC mode programming.

Lower Page Only (LPO) Programming

Certain embodiments disclosed herein provide for paired page corruption mitigation through lower page only (LPO) programming of host data. Such functionality may be performed by the controller 430 and/or programming module 432 described above in connection with FIG. 4. As an example, new incoming host write data may be stored in user data MLC super blocks using only lower (LSB) pages; the upper pages of such blocks may not be programmed at such time. At a later time, for example during garbage collection procedures, the host data stored in the lower pages (LPO data) of the designated super blocks may be moved to other super blocks, utilizing both pages of such blocks.

In certain embodiments, the forward map maintained by the controller is not updated until the data is safely moved to the new super blocks and programmed in both upper and lower pages. Therefore, because the LPO data is not erased from the LPO blocks until after successful programming has occurred, power loss, or other paired page corruption may not result in lower page data loss.

LPO programming can have a positive effect on performance with respect to the amount of parity data that is used or required for error correction. Parity data may be calculated using an exclusive or (XOR) sum of the bits of pages of data, for example yielding '0' for even parity and '1' for odd parity. For example, in certain embodiments, each page is of data is compared with the previous page using XOR, and the result is accumulated and periodically saved (e.g., to a blank page, or "parity page"). Because parity is generally dependent upon all the relevant bits, corruption of any one bit may be revealed by examination of parity data in error detection.

The parity stripe length represents the number of user data elements (e.g., pages) that are associated with a single parity element; a relatively high parity rate may negatively impact storage capacity because more storage is dedicated to parity rather than user data. Use of LPO programming, as described herein, may advantageously allow for a parity stripe length that is higher than certain other systems. For example, in non-LPO systems, the parity stripe length may be limited by a desire to avoid paired pages being associated with the same parity element; the geometry of the memory module may dictate the parity stripe length. For example, memory geometry may limit the parity stripe length to approximately 15:16, or lower. When only one of the two available pages in a cell is used to program user data, it may be possible to use relatively longer, or indefinitely long, parity stripes. For example, parity stripe in the range of 127:128, 1023:1024, or greater may be used.

With further reference to FIG. 4, in certain embodiments, the controller 430 is configured to open super blocks in an LPO mode. New incoming host write data will be stored in user data MLC super blocks that have been opened in LPO mode. To such end, the controller 430 may maintain information indicating a reduced number of pages that are expected to be used in programming the LPO blocks. Specifically, approximately half the pages may be allocated for programming. In certain embodiments, super blocks opened in LPO mode are designated and tracked as LPO blocks, such that the controller 430 will know not to look for valid data in the upper pages of such blocks.

LPO programming, as described herein, may result in at least temporary increase in write amplification (WA) for certain workloads, thereby effectively decreasing the amount of data that can be written over time. For example, LPO programming may use only approximately half the potentially available pages of blocks for at least some program/erase cycles. However, because the LPO blocks may be repacked during garbage collection, the relevant reduction in capacity may be relatively small.

Modified Garbage Collection

Garbage collection is a memory management mechanism that allows for reclamation of pages of memory that are no longer valid. As a result of writing and updating data within the memory, some pages become invalidated. This causes fragmentation of the memory over time. In order to reclaim the storage space occupied by invalid data, garbage collection involves selecting the appropriate block(s), moving all valid pages to new open block(s), and erasing the selected block. In this way, the garbage collected block can become available for use in connection with a write operation. For example, the garbage collection module 434 can select regions of memory for garbage collection. In one embodiment, regions with the least amount of valid data can may be selected for garbage collection. The amount of valid data of a given block may be represented by metadata indicating an amount of valid or stale data in a block (e.g., a "stale count"). In another embodiment, regions having an amount of valid data that is less than a threshold amount can be selected for garbage collection. In one embodiment, such region can be freed up by moving only valid data to another region (e.g., free region or region designated as free).

Garbage collection functionality may advantageously be modified with respect to LPO blocks. For example, if garbage collection generally puts validly-mapped lower page data at risk, it may be modified to "skip" over the upper pages for those lower pages currently in use in the forward table. Furthermore, garbage collection metrics can be used to modify the rate of wear of LPO blocks in view of the reduced effective capacity of such blocks. For example, when an LPO block is closed, the stale count of the block may be augmented to reflect the limited capacity of the block. In an embodiment, the stale count is augmented to reflect a half-stale state.

It may be desirable to modify the stale count for LPO blocks because the rate of wear of a block can depend on how frequently it is erased. In the absence of modified stale count values for LPO blocks, such blocks may not be selected for garbage collection with desirable frequency because only half of their pages (i.e., the lower pages) may be potentially valid. Therefore, by augmenting the stale count of LPO blocks, such blocks may be selected more frequently for garbage collection. In certain applications, such an augmented stale count may result in effectively any LPO super block being considered a good candidate for garbage collection.

In certain embodiments, the ready list threshold at which garbage collection operations begin may be altered for LPO blocks. For example, the ready list threshold may be determined based at least in part on the following equation:

Adjusted ready list length=((number of superblocks)
*0.5)+(2*ideal ready list length))

Modified Wear Leveling

The garbage collection/wear leveling module 434 may be configured to promote even distribution of data writes over the blocks of the solid-state storage 440 by implementing an algorithm by which the controller 430 re-maps logical block addresses to different physical block addresses in the solid-state memory array. Because LPO blocks may only be programmed to half capacity, and therefore subject to less wear than fully-programmed blocks, simply tracking the number of program/erase cycles of LPO blocks may lead to uneven wearing of the memory array. Furthermore, when data is read back from solid-state storage, the voltage threshold levels used may be based at least in part on assumptions about the level of wear of the blocks. Therefore, improper accounting of the wear level of blocks can be problematic.

In certain embodiments, to account for the reduced wearing of LPO blocks, the controller and/or wear leveling module 434 may be configured to track the number of times a given block is used as an LPO block. For example, a LPO count variable may be maintained in page header metadata or in a system table to indicate the number of times a particular super block has been used as an LPO block. The LPO count may be used in a manner similar to wear leveling in order to prevent a single block from being used in LPO mode significantly more often than other blocks. In an embodiment, the controller 430 is configured to ensure that a block has an LPO count within approximately 200 of the average LPO count, or other number.

Relaxation Time

"Relaxation time," as used herein, may be defined as the difference in time from when the last page of a block is programmed and the time when the block is erased. If a single block is recycled too quickly, it may incur undue wear. As described above, augmented stale counts may be implemented for LPO blocks as a modified garbage collection mechanism. As a result, for certain workloads, it may be likely that LPO blocks will frequently be considered relatively stale, depending on the degree of augmentation. Therefore, it may be desirable to modify or control relaxation times of closed LPO super blocks to avoid undue wear. For example, under certain conditions, an LPO block may be selected for garbage collection substantially immediately after closing, and placed back onto the ready block queue (described in greater detail below in connection with the ready block pool 510 of FIG. 5), and then subsequently selected for use undesirably quickly; such process may repeat, thereby causing undue wearing of the block.

In certain embodiments, a minimum relaxation time is determined and implemented to prevent a super block from being recycled too quickly. In certain embodiments, the ready block list length may be set to at least partially control the relaxation time of LPO super blocks. The blocks that go through garbage collection may be placed at the end of the ready list, wherein the open blocks in front in the queue are each programmed before the given block is programmed. The size of the ready list may be selected such that the shortest period of time in which a block can possibly move from the back of the ready list to the front is greater than or equal to the desired relaxation time. In certain embodiments, a time period of approximately 60 seconds may be used for the relaxation time.

Programming Flow

Figure 5:
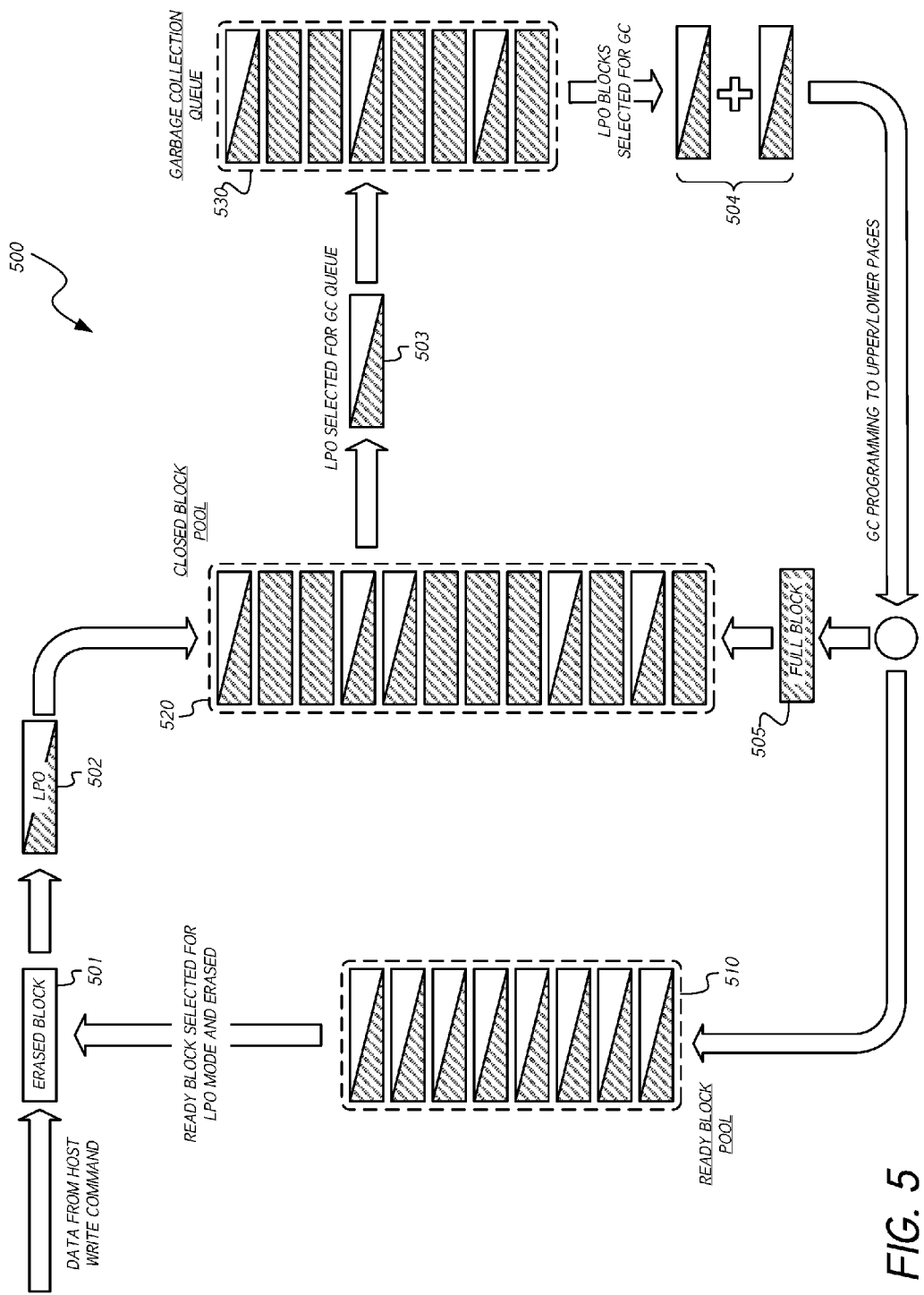
FIG. 5 is a data flow diagram illustrating a process for managing blocks of storage in a data storage environment.

FIG. 5 is a data flow diagram illustrating a process 500 for managing blocks of storage in a data storage environment. The process 500 involves a data storage system, such as a controller of the data storage device/system shown in FIG. 4, receiving host data associated with a host-issued write command, wherein the write command directs the controller to write at least a portion of the data to a solid-state memory device. In order to write data to the solid-state memory device, the process 500 may involve selecting a block for programming and erasing the block to allow for the block to be programmed. In certain embodiments, the process 500 involves programming host data initially to blocks designated for lower-page-only (LPO) programming. Therefore, the block 501 may be designated as an LPO block and programmed only in lower pages, as described in greater detail above. In certain embodiments, the process 500 involves maintaining metadata associated with the block 501 to indicate that the block has been selected for LPO mode and/or how many times the block has been selected for LPO mode.

Once the block 502 is programmed in LPO mode, it may be added to a pool of closed blocks that have programmed data. The process may further include performing some data consolidation with regard to the programmed blocks. For example, over time, some or all of the data in a programmed block may become invalid. Data consolidation operations, such as garbage collection, may allow for data in partially invalid blocks to be consolidated into fewer blocks, thereby allowing for previously closed blocks to be erased and reused for programming. In certain embodiments, LPO blocks may be selected for data consolidation, and may be placed into a queue 530 for awaiting rearrangement of data into other blocks. In certain embodiments, selection of blocks for data consolidation is based at least in part on metadata associated with blocks that indicates how stale a given block is. The term "stale" is used herein according to its broad and ordinary meaning and may indicate in the context of a block of storage how many, or what portion, of a blocks pages or cells contain invalid, or valid, data. Because an LPO block, at a maximum, has a data capacity that is 50% of the capacity of an MLC block, certain embodiments of the process 500 include augmenting staleness metadata associated with an LPO block to indicate that the block may contain a reduced amount of valid data. This is done so that when both types of blocks are considered for garbage collection, the reduced capacity of LPO blocks relative to MLC blocks are taken into consideration in a scheme that uses staleness as a selection factor for garbage collection block selection. For example, the stale count of an LPO block that has all valid data may nonetheless indicate that the block is approximately half-stale. Such staleness augmentation may result in the LPO block being selected for data consolidation sooner than it otherwise would.

During data consolidation (e.g., garbage collection), data in the LPO block may be reprogrammed to a block in an MLC programming mode (data programmed to both upper and lower pages). Block 505 is an example of a block that has been programmed in MLC mode containing valid data saved from a garbage collection process. In certain embodiments, after data from a block has been reprogrammed for data consolidation purposes, the block is erased. Alternatively, the block may not be erased until it is selected again for programming. Therefore, the ready block pool 510 may include erased blocks, or may include primarily blocks comprising invalid data. In certain embodiments, LPO programming, as illustrated in FIG. 5, may allow for data protection in the event of upper page programming failure, as described in greater detail above.

Figure 6:
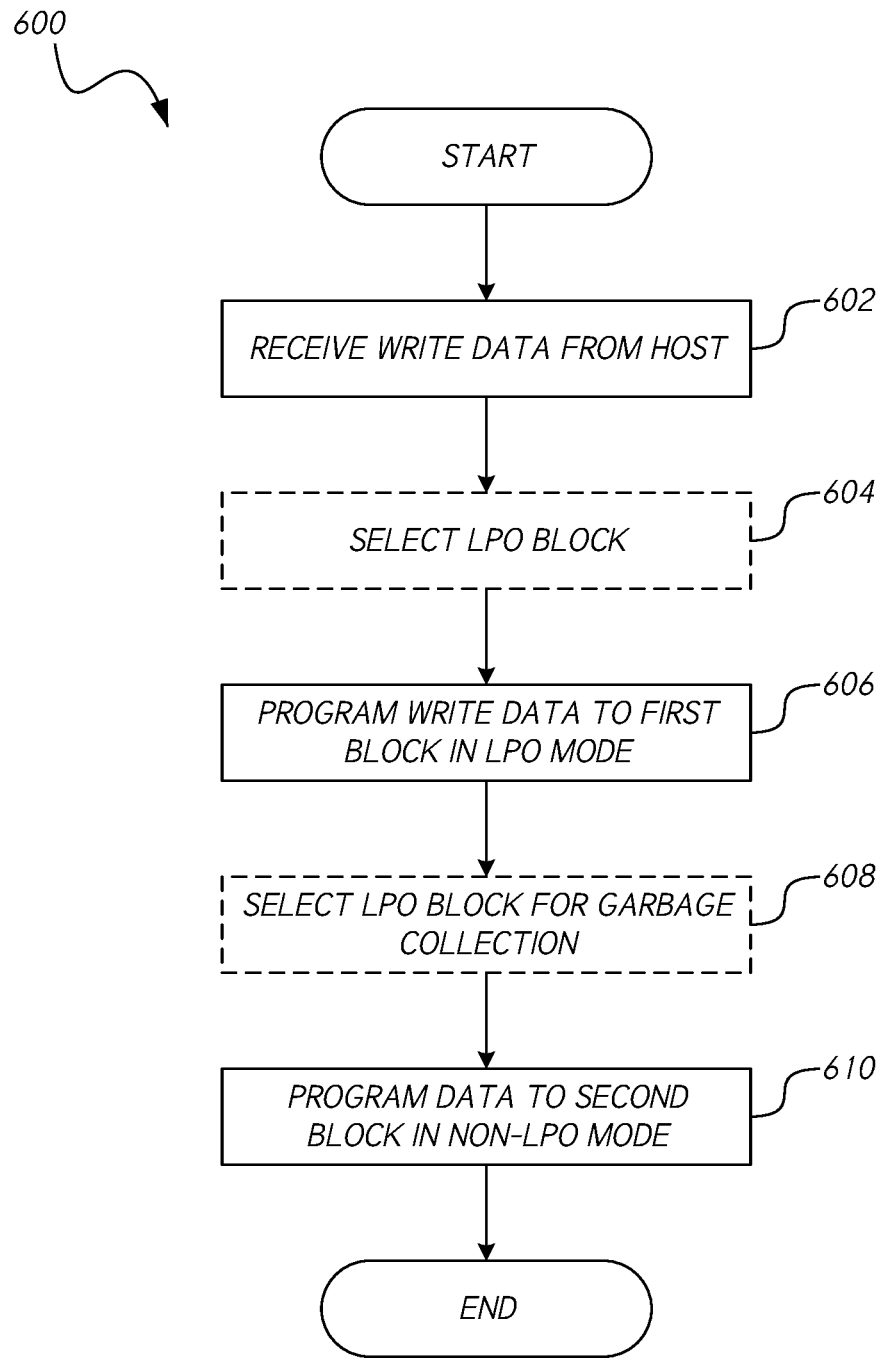
FIG. 6 is a flow diagram illustrating a process for programming data in a non-volatile memory array according to an embodiment.

FIG. 6 is a flow diagram illustrating a process 600 for programming data in a non-volatile memory array according to an embodiment. The process 600 may be performed at least in part by a controller of a data storage device/system, such as that shown in FIG. 4. The process 600 includes receiving write data from a host system (block 602). At block 604, one or more blocks of storage may be selected for lower page only (LPO) programming. At block 606, the write data is programmed to one or more blocks in LPO mode. At block 608, the LPO block(s) may be selected for data consolidation (e.g., garbage collection), wherein, as shown at block 610, the data is reprogrammed to one or more other blocks not in an LPO mode. For example, the data may be programmed to the new block(s) using MLC programming.

Additional Embodiments

Those skilled in the art will appreciate that in some embodiments, other types of paired page corruption mitigation systems can be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A device comprising:
   a non-volatile solid-state memory array comprising a plurality of blocks, each of the plurality of blocks configured to store data in a single-bit per cell mode or a multiple-bit per cell mode; and
   a controller configured to:
      receive write data from a host device;
      program the write data to a first block of the plurality of blocks of the memory array using the single-bit per cell mode; and
      perform a data consolidation operation on the first block at least in part by re-programming at least a portion of the write data together with data stored in a separate second block of the memory array to a third block of the memory array using the multiple-bit per cell mode.

2. The device of claim 1, wherein the data consolidation operation is a garbage collection operation.

3. The device of claim 1, wherein the data stored in the second block is stored in the second block using the single-bit per cell mode.

4. The device of claim 1, wherein the controller is further configured to recover the at least a portion of the write data from the first block when a failure condition is encountered while re-programming the at least a portion of the write data to the third block.

5. The device of claim 1, wherein a write data-to-parity data ratio of the first block is greater than a write-data-to-parity-data ratio of the third block.

6. The device of claim 1, wherein the controller is further configured to maintain stale count data associated with the plurality of blocks of the non-volatile solid-state memory array.

7. The device of claim 6, wherein the controller is further configured to modify a stale count associated with the first block to indicate that the first block is programmed using the single-bit per cell mode.

8. The device of claim 1, wherein the controller is further configured to maintain information associated with the plurality of blocks of the non-volatile solid-state memory array that indicates a number of times each of the plurality of blocks has been programmed using the single-bit per cell mode.

9. The device of claim 1, wherein the controller is further configured to prevent the first block from being programmed again using the single-bit per cell mode within a predetermined relaxation time period after completion of said data consolidation operation.

10. The device of claim 1, wherein the controller is further configured to maintain a ready block list and to set length of the ready block list to a predetermined value.

11. A data storage device comprising:
    a non-volatile solid-state memory array comprising a plurality of blocks, each of the plurality of blocks configured to store data in a single-bit per cell mode or a multiple-bit per cell mode;
    means for receiving write data from a host device;
    means for programming the write data to a first block of the plurality of blocks of the memory array using the single-bit per cell mode; and
    means for performing a data consolidation operation on the first block at least in part by re-programming at least a portion of the write data together with data stored in a separate second block of the plurality of blocks to a third block of the plurality of blocks using the multiple-bit per cell mode.

12. The data storage device of claim 11, wherein the means for programming the write data to the first block of the plurality of blocks comprises a controller including data storage storing instructions and one or more processors configured to execute the instructions, wherein the instructions, when executed by the one or more processors, cause the one or more processors to perform said programming the write data to the first block.

13. The data storage device of claim 11, wherein a write data-to-parity data ratio of the first block is greater than a write-data-to-parity-data ratio of the third block.

14. A method of storing data in a data storage system, the method comprising:
    receiving write data from a host device;
    programming the write data to a first block of a non-volatile solid-state memory module using single-bit per cell programming; and
    performing a data consolidation operation on the first block at least in part by re-programming at least a portion of the write data together with data stored in a separate second block of the non-volatile solid-state memory module to a third block of the non-volatile solid-state memory module using multiple-bit per cell programming;
    wherein the method is performed using a controller of the data storage system.

15. The method of claim 14, further comprising recovering the at least a portion of the write data from the first block when a failure condition is encountered while re-programming the at least a portion of the write data to the third block.

16. The method of claim 14, wherein a write data-to-parity data ratio of the first block is greater than a write data-to-parity data ratio of the third block.

17. The method of claim 14, further comprising augmenting a stale count associated with the first block to indicate that the first block is programmed using single-bit per cell programming.

18. The method of claim 14, further comprising preventing the first block from being programmed again using single-bit per cell programming within a predetermined relaxation time period after completion of said data consolidation operation.

19. The method of claim 14, further comprising maintaining stale count data associated with the first, second and third blocks of the non-volatile solid-state memory array.

20. The method of claim 19, further comprising modifying a stale count associated with the first block to indicate that the first block is programmed using single-bit per cell programming.

* * * * *